(12) United States Patent
Cleavelin

(10) Patent No.: US 7,122,442 B2
(45) Date of Patent: Oct. 17, 2006

(54) METHOD AND SYSTEM FOR DOPANT CONTAINMENT

(75) Inventor: Cloves Rinn Cleavelin, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/897,634

(22) Filed: Jul. 22, 2004

(65) Prior Publication Data

US 2006/0019465 A1   Jan. 26, 2006

(51) Int. Cl.
  *H01L 21/76* (2006.01)

(52) U.S. Cl. .............. 438/406; 438/479; 257/E21.563

(58) Field of Classification Search ........ 438/149–166, 438/197, 311, 404–407, 418, 423, 142, 148, 438/400, 455, 478, 479, 491; 257/347, 349, 257/354, 507, 510, E27.112, E21.32, E21.545, 257/E21.561, E21.564, E21.562, E21.563
See application file for complete search history.

(56) References Cited

U.S. PATENT DOCUMENTS

| | | | | |
|---|---|---|---|---|
| 5,468,657 | A * | 11/1995 | Hsu | 438/766 |
| 6,144,094 | A * | 11/2000 | Kobayashi | 257/748 |
| 6,410,938 | B1 * | 6/2002 | Xiang | 257/49 |
| 6,512,244 | B1 * | 1/2003 | Ju et al. | 257/59 |
| 6,541,861 | B1 * | 4/2003 | Higashi et al. | 257/751 |
| 6,583,440 | B1 | 6/2003 | Yasukawa | 257/59 |
| 6,780,720 | B1 * | 8/2004 | Burnham et al. | 438/287 |
| 6,784,494 | B1 * | 8/2004 | Mitani | 257/347 |
| 6,864,155 | B1 * | 3/2005 | Wang | 438/459 |
| 2002/0187619 | A1 * | 12/2002 | Kleinhenz et al. | 438/471 |

OTHER PUBLICATIONS

G.Q. Lo and Dim-Lee Kwong, "*The Use of Ultrathin Reoxidized Nitrided Gate Oxide for Suppression of Boron Penetration in BF+2-Implantd Polysilicon Gated p-MOSFET's*," IEEE Election Device Letters, vol. 12, No. 4 (pp. 175-177), Apr. 1991.

Zhixu Zhou, Steven Tinkler, Dieter K. Schroder, Ron Paulsen, Phillip Dahl, Rich Keating, and Changhae Park, "*Post Poly-Si Gate Rapid Thermal Nitridation for Boron Penetration Reduction and Oxide Reliability Improvement*,", IEEE Election Device Letters, vol. 19, No. 7 (pp. 237-241), Jul. 1998.

* cited by examiner

*Primary Examiner*—Brook Kebede
(74) *Attorney, Agent, or Firm*—Rose Alyssa Keagy; W. James Brady; Frederick J. Telecky, Jr.

(57) ABSTRACT

According to one embodiment, a semiconductor device is provided. The semiconductor device includes an oxide layer. The semiconductor device also includes a silicon layer disposed outwardly from the oxide layer and having at least one region comprising a dopant. The semiconductor device also includes a dielectric layer disposed outwardly from the silicon layer. The semiconductor device also includes a gate disposed outwardly from the dielectric layer. The semiconductor device also includes a blocking layer disposed between the oxide layer and the silicon layer. The blocking layer is operable to at least partially block a transfer of the dopant from the at least one region of the silicon layer to the oxide layer.

12 Claims, 2 Drawing Sheets

METHOD AND SYSTEM FOR DOPANT CONTAINMENT

TECHNICAL FIELD OF THE INVENTION

This invention relates generally to semiconductors and more particularly to a method and system for dopant containment.

OVERVIEW

Inappropriate distribution of dopants in a semiconductor device may degrade the performance of the semiconductor device. For example, a silicon on insulator field effect transistor (SOIFET) having an ultra-thin body silicon on insulator may suffer from diffusion of boron ions from channels, channel extensions, and/or the source/drain regions. Such diffusion leads to an unintended change in the dopant concentration, which in turn changes transistor characteristics.

SUMMARY OF EXAMPLE EMBODIMENTS

According to one embodiment, a semiconductor device is provided. The semiconductor device includes an oxide layer. The semiconductor device also includes a silicon layer disposed outwardly from the oxide layer and having at least one region comprising a dopant. The semiconductor device also includes a dielectric layer disposed outwardly from the silicon layer. The semiconductor device also includes a gate disposed outwardly from the dielectric layer. The semiconductor device also includes a blocking layer disposed between the oxide layer and the silicon layer. The blocking layer is operable to at least partially block a transfer of the dopant from the at least one region of the silicon layer to the oxide layer.

In another embodiment, a method of semiconductor fabrication is provided. The method includes forming an oxide layer. The method also includes forming a silicon layer outwardly from the oxide layer. The silicon layer has at least one region comprising a dopant. The method also includes forming a dielectric layer outwardly from the silicon layer. The method also includes forming a gate outwardly from the dielectric layer. The method also includes forming a blocking layer between the oxide layer and the silicon layer. The blocking layer comprises a material that is operable to at least partially block a transfer of the dopant from the at least one region of the silicon layer to the oxide layer.

Various embodiments may realize some, none, or all of the following advantages. For example, according to one embodiment, one or more operational characteristics of a semiconductor device are maintained by blocking a transfer of a dopant, such as boron, into an oxide layer. In another embodiment, boron diffusion into a buried oxide layer is minimized using a nitrided layer disposed between a doped region and the buried oxide layer.

Other advantages may be readily ascertainable by those skilled in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS

According to one embodiment, a semiconductor device is improved by at least partially blocking a transfer of dopant between different regions of the semiconductor device. Example methods of blocking a transfer of dopant in a semiconductor device are described below in conjunction with FIGS. 1 through 6, which are a series of schematic cross-sectional diagrams illustrating one embodiment of a semiconductor device 10 constructed according to one embodiment of the present invention. FIGS. 1 through 6 are described jointly.

Figure 1:
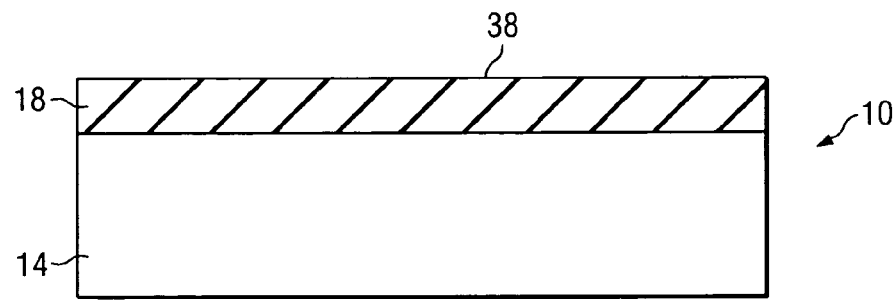
FIGS. 1 through 6 are a series of schematic cross-sectional diagrams illustrating one embodiment of a semiconductor device constructed according to one embodiment of the present invention.

Referring to FIG. 1, a semiconductor device 10 comprises a silicon layer 14 and an oxide layer 18 disposed outwardly from silicon layer 14. Throughout this description, the terms "outwardly" and "inwardly" are used to describe relative positions of structures. These terms are not intended to require a particular orientation of device 10. Oxide layer 18 comprises a side 38 opposite from silicon layer 14, and may be formed from any suitable material using any suitable method. For example, silicon dioxide may be used to form oxide layer 18 over silicon layer 14 using plasma deposition. In some embodiments, oxide layer 18 will serve as a buried oxide layer (BOx).

Figure 2:
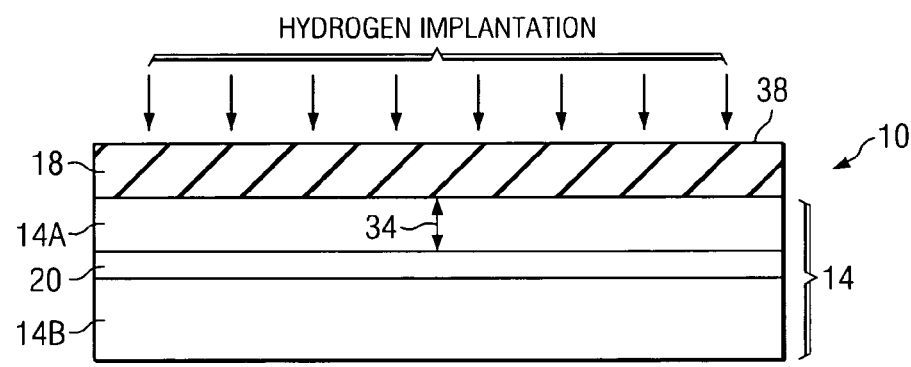

Referring to FIG. 2, a silicon layer 14A is defined from silicon layer 14 shown in FIG. 1 by providing a hydrogen zone 20 in silicon layer 14. Hydrogen zone 20 may be formed using any suitable method, such as hydrogen implantation. The particular location of zone 20 in silicon layer 14 is determined by a desired thickness 34 of silicon layer 14A. For example, where a thin silicon layer 14A is being formed as part of a process for manufacturing a silicon-on-insulator field effect transistor (SOIFET), zone 20 is formed in a location where thickness 34 is approximately one hundred angstroms or less. In one embodiment, hydrogen is implanted into zone 20 through oxide layer 18. This is advantageous in some embodiments because hydrogen implantation through oxide layer 18 protects silicon layer 14A. However, hydrogen implantation may be performed prior to the formation of oxide layer 18 in some embodiments.

Figure 3:
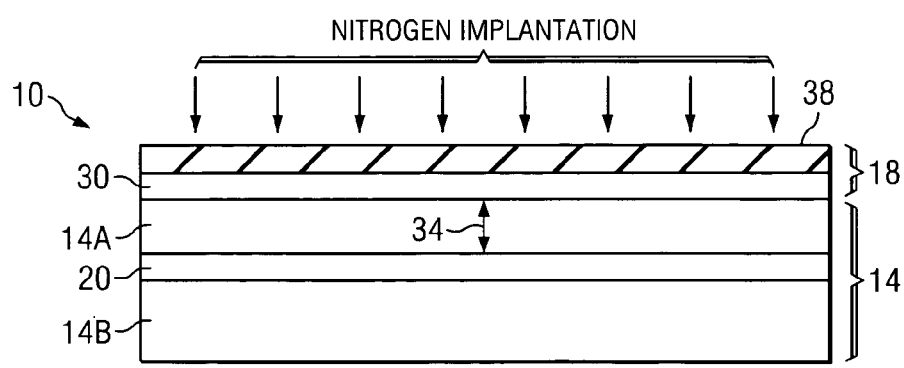

Referring to and as shown in FIG. 3, a blocking layer 30 is formed in oxide layer 18 approximately along an area where oxide layer 18 meets silicon layer 14A. Blocking layer 30 may be formed from any suitable material depending on the type of dopant to be blocked. For example, where boron ions are used to dope portions of semiconductor device 10, such as a region of silicon layer 14A, blocking layer 30 may include a particular concentration level of nitrogen. In some embodiments, blocking layer 30 has a nitrogen concentration level in the following ranges; at least 5 percent, 20 to 30 percent, or less than 40 percent, for example. Any suitable method, such as thermal nitridation, plasma nitridation, plasma-assisted implant, and thermal RTP process, may be used to form blocking layer 30 in oxide layer 18.

Figure 4:
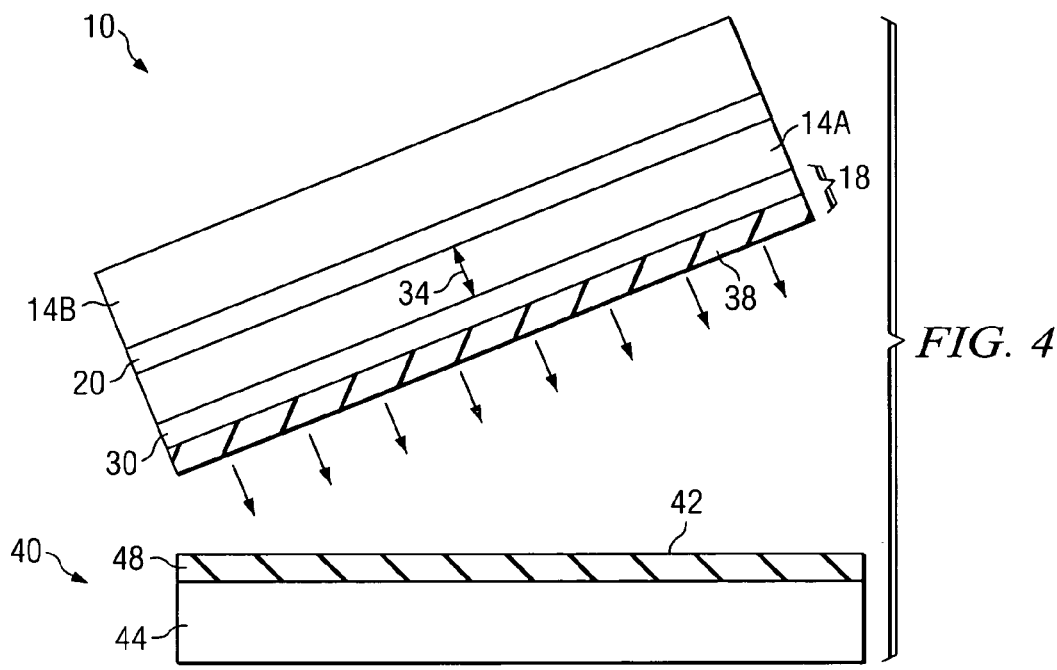

Referring to FIG. 4, a construction 40 comprising a silicon layer 44 and an oxide layer 48 having a side 42 opposite from silicon layer 44 is provided, and device 10 is coupled to construction 40 by coupling side 38 of oxide layer 18 to side 42 of oxide layer 48. In this document, "coupled" or "couple" refers to any direct or indirect connection between two or more objects. Using construction 40 having oxide layer 48 is advantageous in some embodiments because such an oxide layer facilitates the bonding between device 10 and construction 40. However, oxide layer 48 may be omitted in some embodiments.

Figure 5:
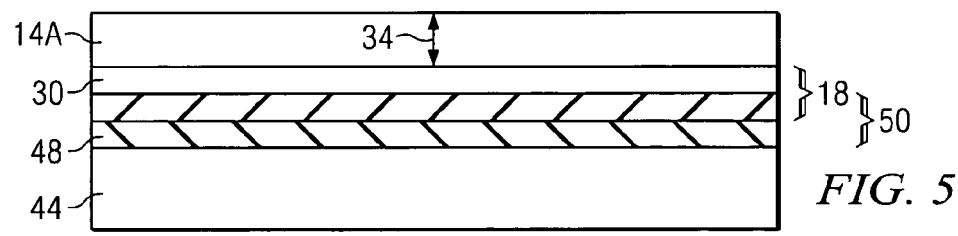

Referring to FIG. 5, oxide layers 48 and 18 are coupled to form an oxide layer 50. Silicon layer 14B has been removed from silicon layer 14A by separating silicon layer 14 along zone 20 using any suitable process. For example, a knife or a high-pressure water stream may be used to separate silicon layer 14 along zone 20. Separating silicon layer 14B from silicon layer 14A along zone 20 is advantageous in some embodiments because the implantation of hydrogen ions in zone 20 weakens silicon layer 14 along zone 20. In some embodiments, removed silicon layer 14B may be reused in other semiconductor applications.

Figure 6:
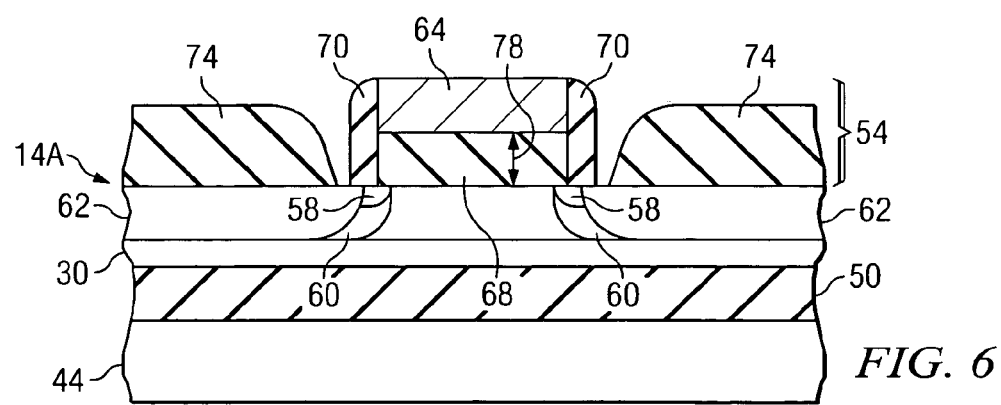

Referring to FIG. 6, a device 54, such as SOIFET, is formed using silicon layer 14A. As an example, device 54 is referred to herein as SOIFET device 54, however, device 54 could comprise another device such as a multi-gate field effect transistor (MuGFET). SOIFET device 54 comprises a gate dielectric 68 disposed outwardly from silicon layer 14A, a gate 64 disposed outwardly from gate dielectric 68, and in one embodiment, side walls 70 disposed outwardly from silicon layer 14A as shown in FIG. 6. Gate dielectric 68 may include a thickness of approximately 17 angstroms; however, gate dielectric 68 may have any suitable thickness. Referring again to FIG. 6, extensions 58, source/drain regions 60, and channels 62 are formed in various regions of silicon layer 14A. To accommodate a relatively thin silicon layer 14A (100 angstroms or less, in one embodiment) of SOIFET device 54, raised source/drain 74 may be formed outwardly from channel 62 of silicon layer 14A.

In some embodiments, gate 64 is doped with a suitable dopant, such as boron, and gate dielectric 68 is operable to at least partially block the diffusion of the dopant from gate 64 into silicon layer 14A. Extensions 58, source/drain regions 60, and channels 62 are doped with a suitable dopant, such as boron. According to one embodiment, blocking layer 30 blocks a transfer of dopant from regions 58, 60, and 62 in silicon layer 14A into oxide layer 50. For example, where the dopant comprises boron, blocking layer 30 comprises a particular concentration level of nitrogen and is operable to at least partially block boron from diffusing into oxide layer 50. Although boron is described as one example of a dopant, other dopants, such as the elements listed in Group III of the periodic table, may be used.

Referring to both FIGS. 3 and 6, providing blocking layer 30 that includes nitrogen between oxide layer 18 and silicon layer 14A is advantageous because a change in concentration of dopant in silicon layer 14A is minimized. Further, in some embodiments, the nitridation of oxide layer 18 may raise the dielectric constant associated with oxide layer 18, which improves short channel effect due to reduced electric field penetration between source/drain regions 60 though oxide layer 18.

Although an example process for forming blocking layer 30 between silicon layer 14A and oxide layer 50 is provided above, any suitable method may be used to provide a blocking layer for blocking a transfer of dopant from silicon layer 14A to oxide layer 50.

Furthermore, although this example shows one particular semiconductor device formed outwardly from blocking layer 30, the general structure and operation of blocking layer 30 disposed outwardly from buried oxide layer 50 could be used to support any number of semiconductor devices. Moreover, although this example shows a blocking layer 30 designed to block transfer of a p-type dopant into buried oxide layer 50, similar concepts can be applied to form a blocking layer 30 that blocks n-type dopants from transferring into buried oxide layer 50.

Although some embodiments of the present invention have been described in detail, it should be understood that various changes, substitutions, and alterations can be made hereto without departing from the spirit and scope of the invention as defined by the appended claims.

What is claimed is:

1. A method of forming a semiconductor device, comprising:

providing a first silicon wafer;

forming a buried oxide layer outwardly from the first silicon wafer, the buried oxide layer having a side opposite from the first silicon wafer;

implanting hydrogen ions into the first silicon wafer to form a hydrogen layer within the silicon wafer;

forming a nitrided blocking layer by implanting nitrogen ions into the buried oxide layer along an area where the buried oxide layer meets the first silicon wafer;

wherein the hydrogen layer and the nitrided blocking layer define a thin silicon layer therebetween, the thin silicon layer having a thickness of approximately 100 angstroms or less;

coupling the side of the buried oxide layer with a second silicon wafer;

separating the first silicon wafer from the thin silicon layer along the hydrogen layer; and forming a dielectric layer disposed outwardly from the thin silicon layer and a gate disposed outwardly from the dielectric layer;

doping the gate and at least one region of the thin silicon layer with boron;

wherein the dielectric layer is operable to at least partially prevent a transfer of boron from the gate to the thin silicon layer, and wherein the nitrided blocking layer is operable to at least partially prevent a transfer of boron from the at least one region of the thin silicon layer to the buried oxide layer.

2. The method of claim 1, wherein coupling the side of the buried oxide layer comprises coupling the side of buried oxide layer with a second silicon wafer through another oxide layer.

3. The method of claim 1, wherein the nitrided blocking layer comprises a nitrogen concentration level of approximately 20–30 percent.

4. A method of forming a semiconductor device, comprising:

providing a first silicon wafer;

forming a buried oxide layer outwardly from the first silicon wafer, the buried oxide layer having a side opposite from the first silicon wafer;

implanting hydrogen ions into the first silicon wafer to form a hydrogen layer within the silicon wafer;

forming a nitrided blocking layer by implanting nitrogen ions into the buried oxide layer along an area where the buried oxide layer meets the first silicon wafer;

wherein the hydrogen layer and the nitrided blocking layer define a thin silicon layer therebetween;

coupling the side of the buried oxide layer with a second silicon wafer; and separating the first silicon wafer from the thin silicon layer along the hydrogen layer.

5. The method of claim 4, further comprising:

forming a dielectric layer disposed outwardly from the thin silicon layer and a gate disposed outwardly from the dielectric layer; and doping the gate and at least one region of the thin silicon layer;

wherein the dielectric layer is operable to at least partially prevent a transfer of the dopant from the gate to the thin silicon layer, and wherein the nitrided blocking layer is operable to at least partially prevent a transfer of the dopant from the at least one region of the thin silicon layer to the buried oxide layer.

6. The method of claim 4, wherein the thin silicon layer has a thickness of approximately 100 angstroms or less.

7. The method of claim 4, wherein coupling the side of the buried oxide layer comprises coupling the side of buried oxide layer with a second silicon wafer through another oxide layer.

8. The method of claim 4, wherein the nitrided blocking layer comprises a nitrogen concentration level of approximately 20–30 percent.

9. The method of claim 4, wherein the nitrided blocking layer comprises a nitrogen concentration level of greater than 30 percent.

10. The method of claim 4, wherein the nitrided blocking layer comprises a nitrogen concentration level of at least 5 percent.

11. The method of claim 5, wherein the dielectric layer comprises a thickness of approximately 20 angstroms or less.

12. The method of claim 5, wherein the dopant is boron.

* * * * *